(12) United States Patent
Lopatinsky et al.

(10) Patent No.: US 7,044,202 B2
(45) Date of Patent: May 16, 2006

(54) COOLER FOR ELECTRONIC DEVICES

(75) Inventors: Edward L. Lopatinsky, San Diego, CA (US); Dan K. Schaefer, Palm Desert, CA (US); Saveliy T. Rosenfeld, San Diego, CA (US); Lev A. Fedoseyev, El Cajon, CA (US)

(73) Assignee: ROTYS Inc., San Diego, CA (US)

( * ) Notice: Subject to any disclaimer, the term of this patent is extended or adjusted under 35 U.S.C. 154(b) by 37 days.

(21) Appl. No.: 10/399,800

(22) PCT Filed: Jun. 27, 2002

(86) PCT No.: PCT/US02/20410

§ 371 (c)(1),
(2), (4) Date: Apr. 21, 2003

(87) PCT Pub. No.: WO03/002918

PCT Pub. Date: Jan. 9, 2003

(65) Prior Publication Data

US 2004/0094290 A1    May 20, 2004

Related U.S. Application Data

(60) Provisional application No. 60/301,321, filed on Jun. 27, 2001.

(51) Int. Cl.
*F24H 3/06*    (2006.01)

(52) U.S. Cl. ............... 165/122; 165/80.3; 165/185; 361/704; 361/697; 257/706; 257/722; 174/16.3

(58) Field of Classification Search ............ 165/80.3, 165/122, 185; 361/697, 704; 417/423.8; 310/64; 257/706, 722; 174/16.3
See application file for complete search history.

(56) References Cited

U.S. PATENT DOCUMENTS 5,615,998 A * 4/1997 Kodama et al. ............ 415/177
5,694,295 A   12/1997 Mochizuki et al.
5,760,333 A   6/1998 Kitahara et al.

(Continued)

FOREIGN PATENT DOCUMENTS

JP    8-195456 A    7/1996

*Primary Examiner*—Terrell Mckinnon (57) ABSTRACT

A cooler for electronic devices provides cool air to the inlet sides of the heat sink by using a radial blower with blades located around air outlets of the heat sink. This blower is driven by a brushless DC electric motor. The motor has an opening in the center allowing for the transfer of incoming air to the center of the heat sink. The rotors outer circumferential arrayed poles are rigidly secured to the frame of the radial blower. The stator of the motor is rigidly secured to the heat sink and has an opening in its center. The stator comprises circumferential arrayed coils on circuit board material. When the current flows through the stator coils, the coils acquire a magnetic polarity. The poles of the rotor and stator coils attract and repel depending on the polarities. The cool air comes simultaneously from opposite sides of the heat sink. For this reason the heat sink has a divider located approximately in the middle of the heat sink fins. The blades of the radial blower are located around the air outlets on the heat sink. Because the ambient air is drawn in from both sides of the heat sink the air path length through the heat sinks channels is effectively halved. This results in an increased cooling ability for the heat sink because of the increase in temperature differentials.

29 Claims, 12 Drawing Sheets

U.S. PATENT DOCUMENTS

| | | | |
|---|---|---|---|
| 5,816,319 A * | 10/1998 | Kamekawa et al. | 165/121 |
| 5,823,249 A * | 10/1998 | Batchelder | 165/121 |
| 5,838,066 A | 11/1998 | Kitajo | |
| 6,019,165 A * | 2/2000 | Batchelder | 165/80.3 |
| 6,021,844 A * | 2/2000 | Batchelder | 165/80.3 |
| 6,152,214 A * | 11/2000 | Wagner | 165/121 |
| 6,157,539 A * | 12/2000 | Wagner et al. | 361/704 |
| 6,175,495 B1 * | 1/2001 | Batchelder | 361/695 |
| 6,196,300 B1 | 3/2001 | Checchetti | |
| 6,244,331 B1 * | 6/2001 | Budelman | 165/80.3 |
| 6,318,976 B1 * | 11/2001 | Hsieh | 417/423.12 |
| 6,348,748 B1 * | 2/2002 | Yamamoto | 310/62 |
| 6,404,634 B1 * | 6/2002 | Mann | 361/704 |
| 6,457,955 B1 * | 10/2002 | Cheng | 417/423.8 |
| 6,466,444 B1 * | 10/2002 | Cheung | 361/703 |
| 2002/0062947 A1 * | 5/2002 | O'Connor | 165/80.3 |
| 2003/0053296 A1 * | 3/2003 | Tanaka et al. | 361/719 |

* cited by examiner

COOLER FOR ELECTRONIC DEVICES

This application is a United States National Phase Application under 35 U.S.C. 371 of International Application No. PCT/US02/20410 filed Jun. 27, 2003.

The application also claims the benefit of provisional application No. 60/301,321 filed Jun. 27, 2001.

FIELD OF THE INVENTION

The present invention relates generally to cooling devices and in particular, to cooling devices used for removing heat from electronic components by means of a gas flow, in particular air produced by a blower.

BACKGROUND OF THE INVENTION

During normal operation many electronic components generate significant amounts of heat. If this heat is not continuously removed the electronic component may overheat resulting in damage and/or a reduction in operating performance. In order to avoid such problems cooling devices are often used in conjunction with these components.

One such cooling device is a fan assisted heat sink. In such a device a heat sink is formed from a material, such as aluminum, which readily conducts heat. The heat sink is usually placed on top of and in physical contact with the component.

One method of increasing the cooling capacity of these heat sinks is by including a plurality of cooling fins that are physically connected to the heat sink. These fins serve to increase the surface area of the heat sink and, thus maximize the transfer of heat from the heat sink to the surrounding atmosphere. In this manner the heat sink draws heat away from the component and transfers the heat into the surrounding air.

In order to further enhance the cooling capacity of a heat sink device an electrically powered blower (an axial fan may serve as the blower) is often mounted within or on top of the heat sink. In operation the fan forces air to move past the fins of the heat sink, thus cooling the fins by enhancing the transfer of heat from the fins into the surrounding atmosphere. As the fins are cooled heat can be drawn from the component into the heat sink at a faster rate. The fan typically draws air into the heat sink from the top, passes the air over the fins, and exhausts the air in the vicinity of the bottom. Accordingly, the exhaust air is hotter than that of the intake air.

There are known devices of this type, for example, U.S. Pat. No. 6,196,300 "Heat sink". The device described in this US patent comprises an axial fan that produces a flow passing by heat exchanging channels of the heat sink. The majority of inlets to the heat exchanging channels are located just opposite the axial fan's impeller with a certain number of said channels being placed radially in relation to fan axle.

To increase the heat exchange area, the heat exchanging channels are made of spiral-like shape and bent backwards in the direction of blower rotation. The axial fan produces a sufficiently high air pressure. However, due to the weak airflow in the area adjacent to fan axle, the conditions for cooling the central part of the heat sink located underneath the fan are unfavorable. In this case non-uniform cooling of the heat sink and electronic component will take place allowing for bad conditions for the heat exchange process.

Centrifugal blowers are used more rarely in cooling device designs for the purpose of producing airflow.

Specifically, U.S. Pat. No. 5,838,066 "Miniaturized cooling fan type heat sink for semiconductor device" offers a design employing a centrifugal blower that is installed to the side of the heat sink. In one particular embodiment of this invention the cooling airflow passes by rectilinear means through the heat exchanging channels of the heat sink.

However, placement of a centrifugal blower to the side of the heat sink increases the devices size and reduces its effectiveness. This is because the location of the centrifugal blower leads to insufficient coordination between the direction of channel inlets and direction of airflow supplied from the blower. The loss in airflow energy results in the reduction of airflow speed in the heat exchanging channels and the reduction of heat exchange efficiency. A portion of energy is also expended as friction against the casing that encloses the blower.

An invention described in the patent of Japan No 8-195456 entitled "Cooler for electronic apparatus". This device comprises a centrifugal fan enclosed in the casing and installed above the heat exchanging channels that are made divergent. Another heat sink surface is made so that the possibility of thermal contact with an electronic device is provided for. The inlet of the centrifugal fan faces the heat sink. The fan produces an airflow that passes by the heat exchanging channels and then gets drawn into the inlet of the centrifugal fan. Since this centrifugal fan operates by drawing air in through the heat sink, there is an area in the central part of the heat sink that receives poor air circulation. Adding to this problem, the airflow first passes through the elongated heat exchanging channels gathering heat along the way from the channels surfaces. As the air approaches the central part of the heat sink its cooling ability is decreased due to the reduced temperature differential between the preheated channel air temperature and the surface temperature at the center of the heat sink. This results in inefficient cooling of the heat sink's central surface area and uneven cooling of the heat sink in general. This is the area where the electrical component is transferring the most heat to the heat sink and where the greater differential between the two is most important. To help overshadow this problem, one has to increase the fans power resulting in an increased airflow but not solving the initial problem. In addition to the heat dissipation problems, the device is considerably large due to the centrifugal fans placement above the heat sink. An electric drive is yet placed above the centrifugal fan increasing the coolers overall size even more.

Electronic component size has decreased significantly in the past and this trend of miniaturization will most likely continue in the future. Therefore the footprint area of electronic devices (namely CPU's) is much smaller now and will be even smaller in the future. This creates the problem of first extracting the heat from a very small surface area and then transferring this heat, with minimal thermal losses, to the larger heat-dissipating device. Traditional flat heat sinks are unable to extract and dissipate the required heat from these small component footprints.

It would be desirable to provide a cooling apparatus that would overcome these problems associated with the present fan assisted heat sink devices.

SUMMARY OF THE INVENTION

Accordingly, it is the object, of the present invention, to provide a cooler that more effectively cools the center of the heat sink and in doing so ensures a more uniform cooling of the attached electronic component.

It is another object, of the present invention, to provide a cooler for electronic components with a reduction in overall size.

Further, it is the object, of the present invention, to provide an electric motor/fan in combination with a heat sink.

It is another object, of the present invention, to provide a cooler for electronic components with increased cooling ability for the heat sink because of the increase in temperature differentials.

This can be achieved by using a new proposed design. This design provides cool air to the inlet sides of the heat sink by using a radial blower with blades located around air outlets of the heat sink. This blower is driven by a brushless DC electric motor that utilizes a ring type permanent magnet rotor. This rotor has an opening in the center allowing for the transfer of incoming air to the center of the heat sink. The rotors outer circumferential arrayed poles are rigidly secured to the frame of the radial blower. The stator of the motor is rigidly secured to the heat sink and has an opening in its center. The stator is composed of circumferential arrayed coils on the circuit board material. When the current flows through the stator coils the coils acquire a magnetic polarity. The poles of the rotor and stator coils attract and repel depending on the polarities. This action provides for a smooth continuous directional motor rotation.

Another novelty of the present invention is that the cool air comes simultaneously from opposite sides of the heat sink. Therefore, the heat sink might have a divider located approximately in the middle of the heat sink fins and perpendicular to the axel. The blades of the radial blower are located around the air outlets on the heat sink. Because the ambient air is drawn in from both sides of the heat sink the air path length through the heat sinks channels is effectively halved. This results in an increased cooling ability for the heat sink because of the increase in temperature differentials.

BRIEF DESCRIPTION OF THE DRAWINGS

The essence of the invention being claimed is explained with the accompanying drawings in which like reference numerals designate like parts throughout the thereof and wherein:

DETAILED DESCRIPTION OF PREFERRED EMBODIMENTS

Preferred embodiments of the present invention will be described in detail below with reference to the accompanying drawings.

Figure 1:
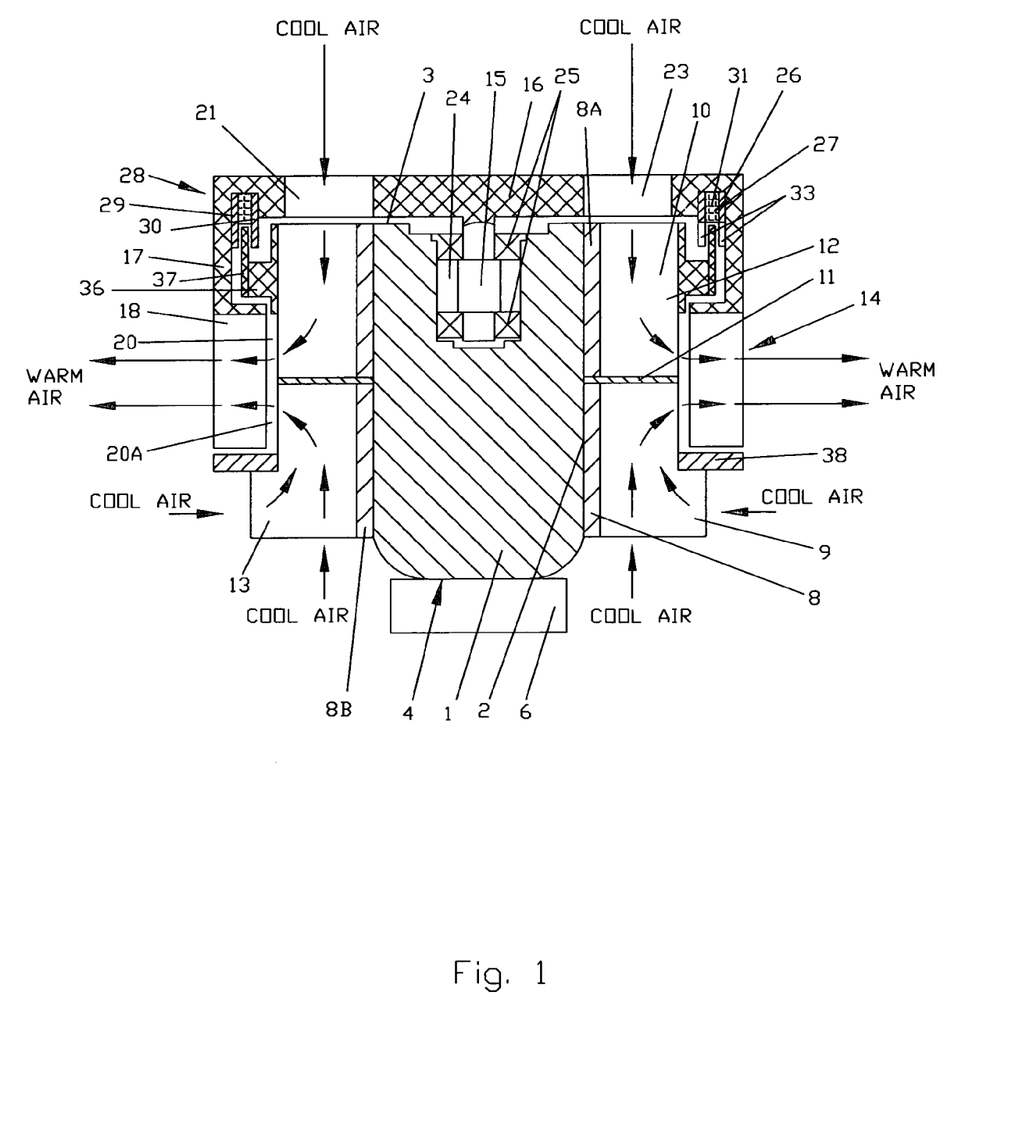
FIG. 1 is an axial sectional view showing a first embodiment of the present invention.

The first embodiment of the present invention is shown in FIG. 1. The cooler includes the central core 1; said central core 1 has a cylindrical shape 2 with a flat top surface 3 and a flat bottom surface 4. The flat bottom surface 4 is for making direct mechanical contact with electronic component heat dissipation footprint 6. Said flat bottom part surface 4 and said electronic component heat dissipation footprint 6 have about the same shape of contact surfaces. Shape the bottom surface usually is the same as the electronic component heat dissipation footprint one.

Figure 3:
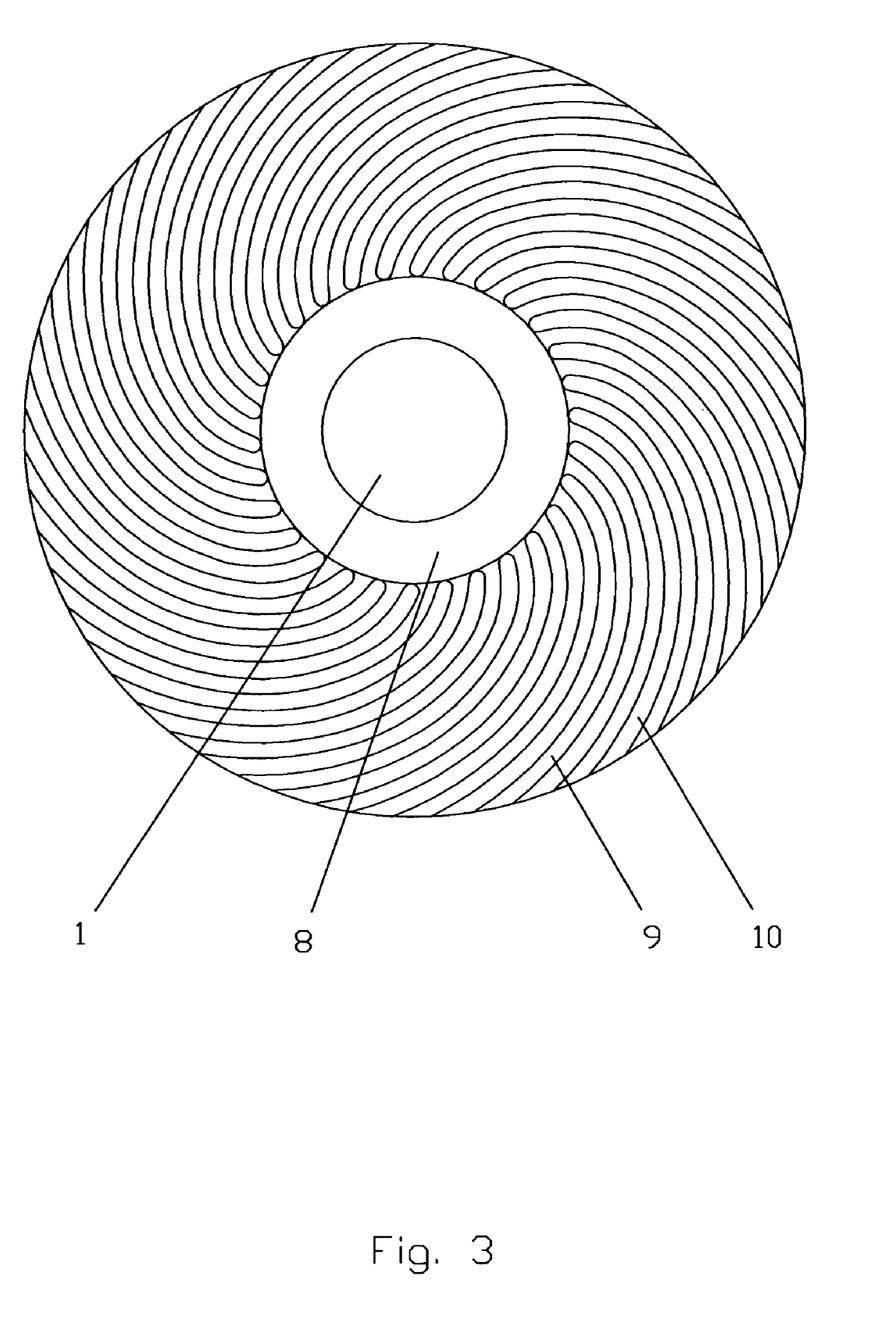
FIG. 3 is a view taken along arrow B of FIG. 2.
Figure 3A:
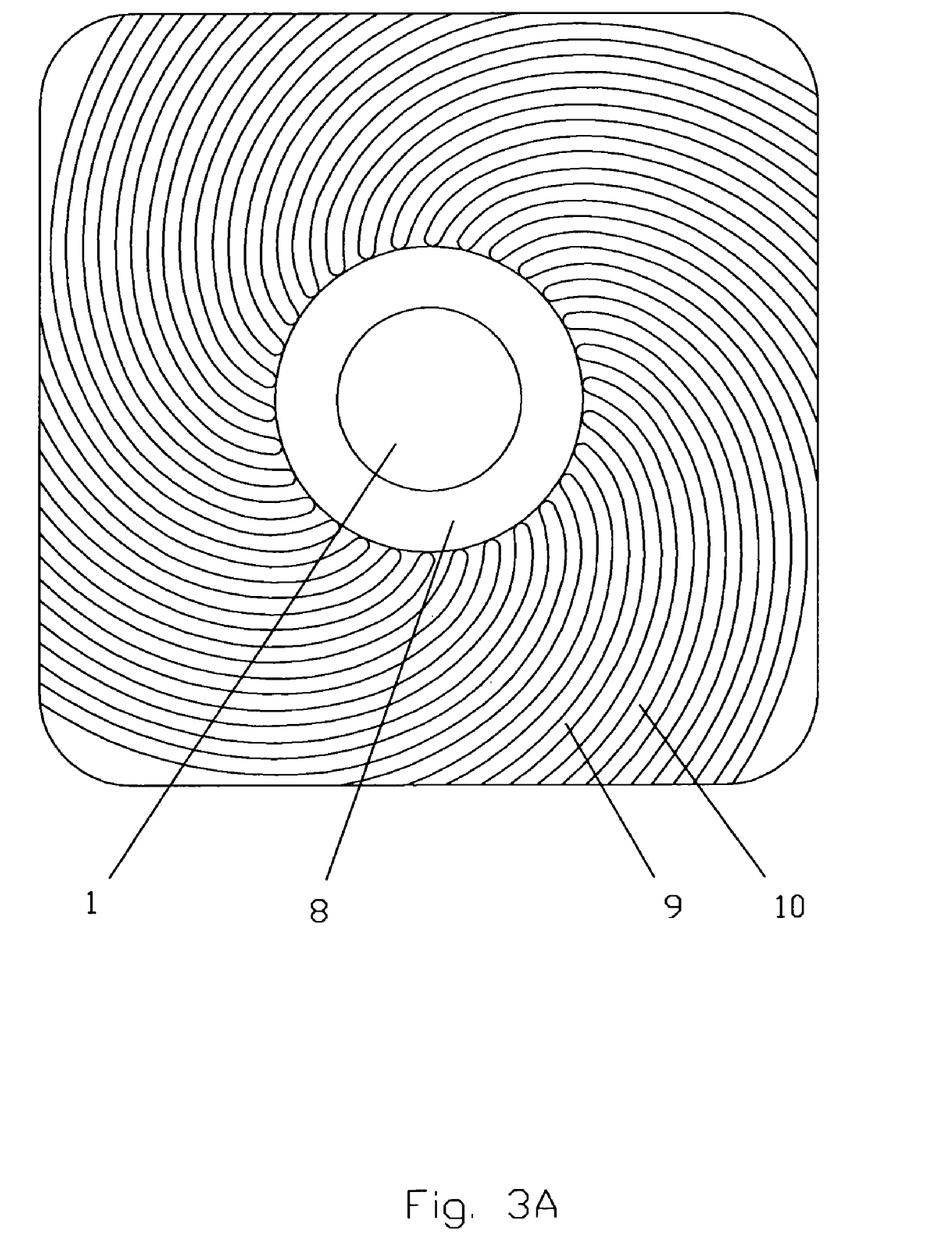
FIG. 3A is an embodiment of the FIG. 3 with the lower part of the heat sink having square form.
Figure 4:
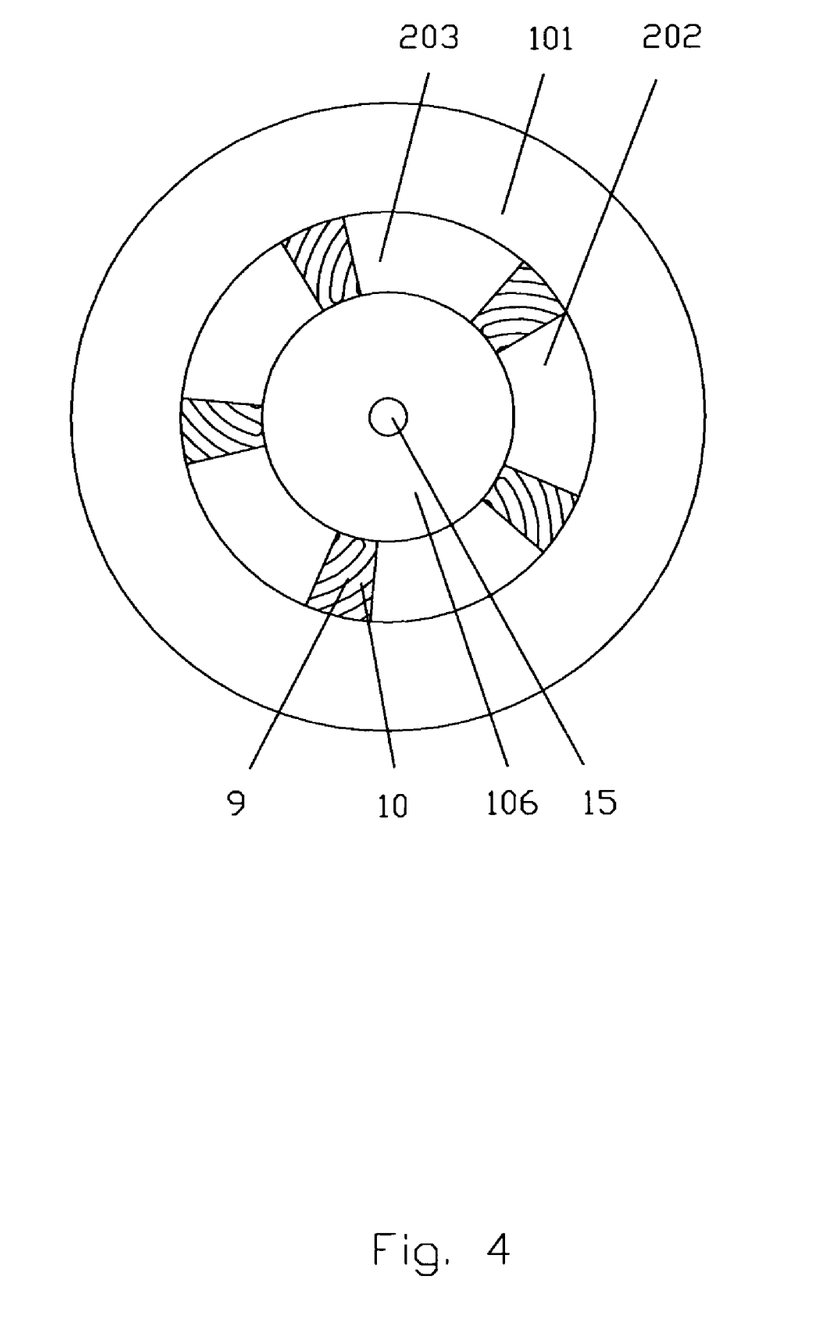
FIG. 4 is an end view of the heat sink view along arrow C of FIG. 2.
Figure 5:
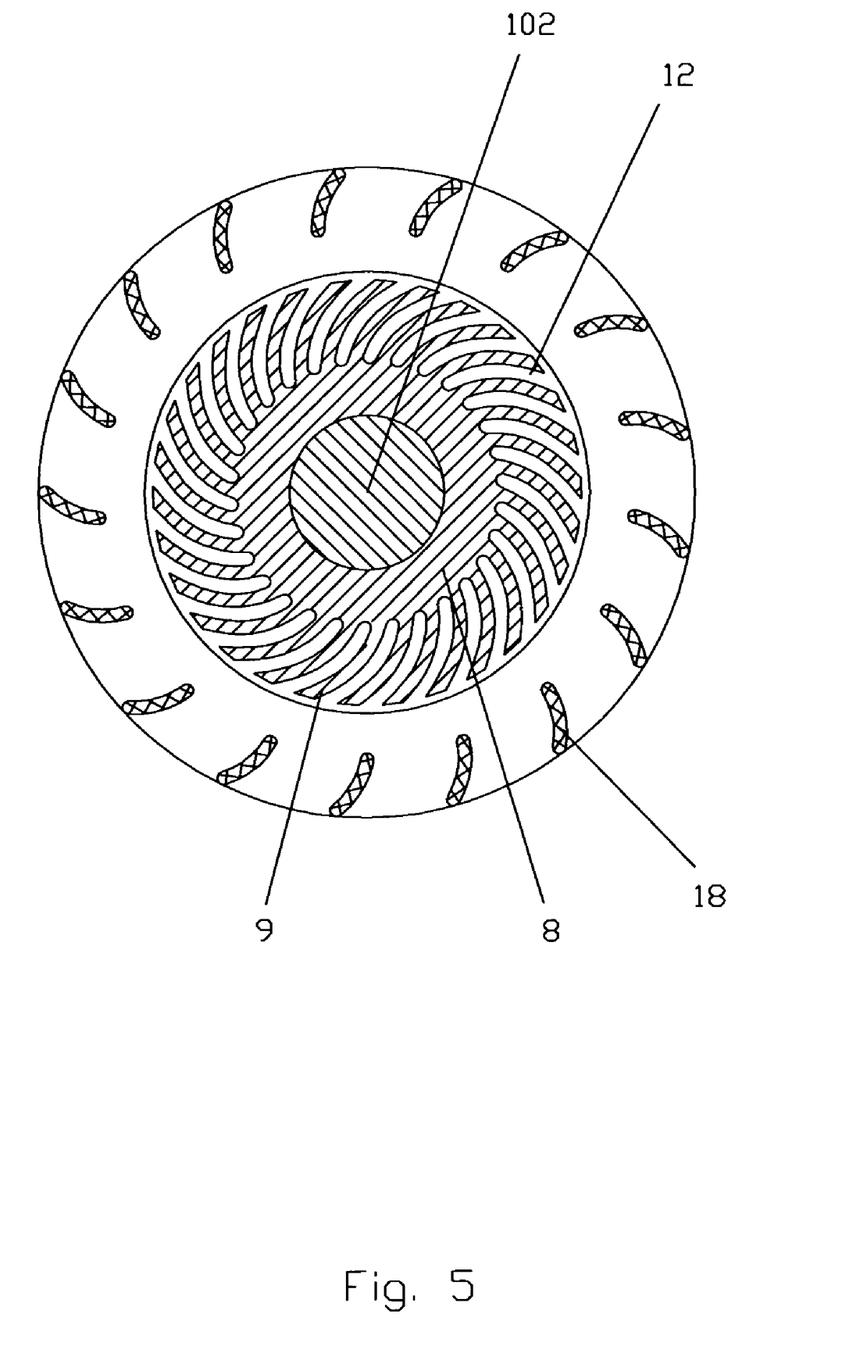
FIG. 5 is a sectional view taken along line I—I of FIG. 2.
Figure 6:
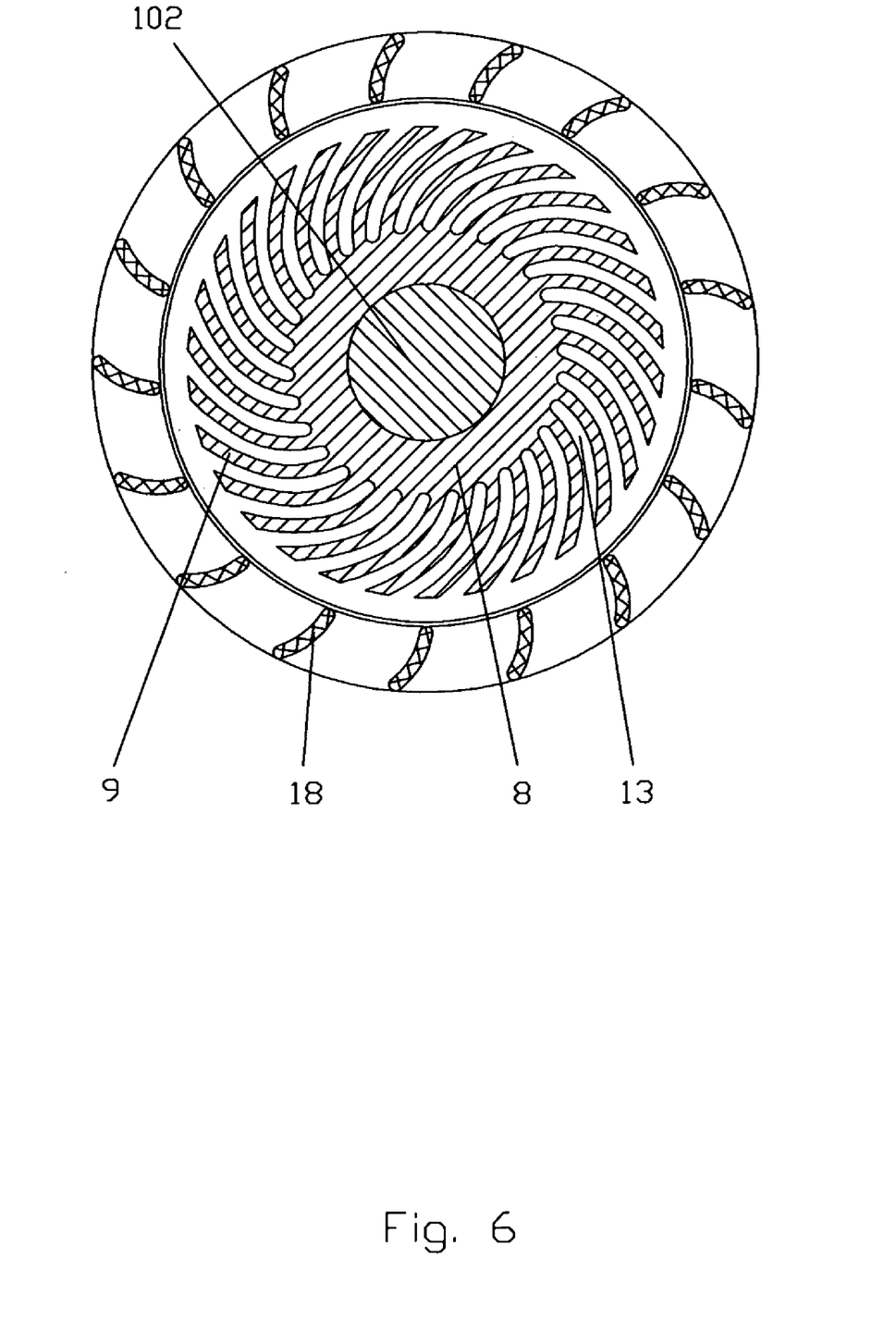
FIG. 6 is a sectional view taken along line II—II of FIG. 2.

The central core 1 is constructed from a good thermal conductive metal and placed inside of a cylindrical bushing 8 that has radial heat exchanging fins 9 protruding out in a radial fashion. Said radial heat exchanging fins 9 protruding out of said central core 1 in radial direction so that surface of said fins 9 is parallel to central axis. The fins 9 may be made spiral-like and bent in the direction of centrifugal type impeller rotation (FIGS. 3, 3A).

The heat exchange channels 10 (FIGS. 3, 3A) are located between adjacent radial fins 9. The fins 9 are bent so that the channel width between two adjacent fins 9 is constant.

A divider 11 placed approximately in the middle of bushing 8 divides the air channels in two individual paths, upper path channels 12 and lower path channels 13 and upper cylindrical bushing 8A and lower cylindrical bushing 8B. The upper cylindrical bushing 8A along with its associated fins 9 and upper path channels 12 form the upper heat sink section. The lower cylindrical bushing 8B along with its associated fins 9 and lower path channels 13 form the lower heat sink section.

Centered in the top of the core 1 is a radial blower 14 that includes a shaft 15, hub 16 and shroud 17 with attached blades 18. The blades 18 of the radial blower 14 are located around at least part of the air outlets 20 and 20A of the channels 12, 13. The divider 11 is placed as to split the length of the rotor blades 18 substantially equally.

The shroud 17 and the blades 18 of the radial blower 14 are secured to the hub 16 by means of struts 21. The struts 21 are constructed in relatively the same shape as the blades of the axial fan 23. The shaft 15 of the radial blower 14 is located in a cavity 24 at the end of the central core 1 and is retained by the bearings 25. This cavity 24 may contain a lubricating material that-changes from thicker to thinner state as the core 1 temperature increases. This thinner lubricant will result in less bearing wear. The shroud 17 of the radial blower 14 has a rounded channel 26. The rotor 27 of the motor 28 is secured in this rounded channel 26. The rotor 26 is shaped like two thin cylinders 29, 30 and is made from a permeable magnetic metal. Said permeable magnetic material may be different type, preferable is silicon electric steel.

The rotor 27 comprises two cylinders 29, 30 and a permanent magnet 31 located between them. The cylinders 29, 30 have teeth 33 that face toward the divider 11. These teeth 33 are the actual rotor poles of the motor 28 and are magnetized in radial direction, said circumferential arrayed like poles of the one magnetized cylinder 29 face opposite polarities relative to said circumferential arrayed like poles of the another magnetized cylinder 30. In the view perpendicular to an axis of rotation, the circumferential arrayed like poles of magnetized cylinder 29 about to coincide with the circumferential arrayed like poles of another magnetized cylinder 30.

Around an upper part of the fins 9 is located cylindrical bushing 36 that secures the stator 37 to the rest of the unit. The stator's coils are fabricated on standard printed circuit board material (will be described in the second embodiment). The unsecured part of the stator 37 is located in a gap formed between the teeth 33 of cylinders 29 and 30. A flat ring 38 is secured on the outside surface of the bottom part of the fins 9. The Hall device 39 that may be a Hall sensing element or Hall switch (FIG. 7) is used to control commutation of the motor 28. An optical device may also be used to control commutation of the motor 28 but has limitations because of interference from ambient light sources. The Hall device 39 is located in close proximity to the rotor 303 (FIG. 7) and positioned to achieve proper rotational direction and optimum performance from the motor 28.

The above describe apparatus functions as follows: When current is commutated through the stator coils the rotor 27 begins to revolve the blades 18 of the radial blower 14 around the central core 1 and its associated fins 9. The rotating blades 18 pull external air simultaneously through the upper channels 12 and lower channels 13 increasing the cooling ability of the heat sink because of the increase in temperature differentials.

These channels 12 and 13 may be made of constant width (FIGS. 3, 3A). The struts 21, fashioned in relatively the same shape as the axial fan blades 23, provide additional airflow to the upper channel 12 improving the overall cooling efficiency.

Figure 2:
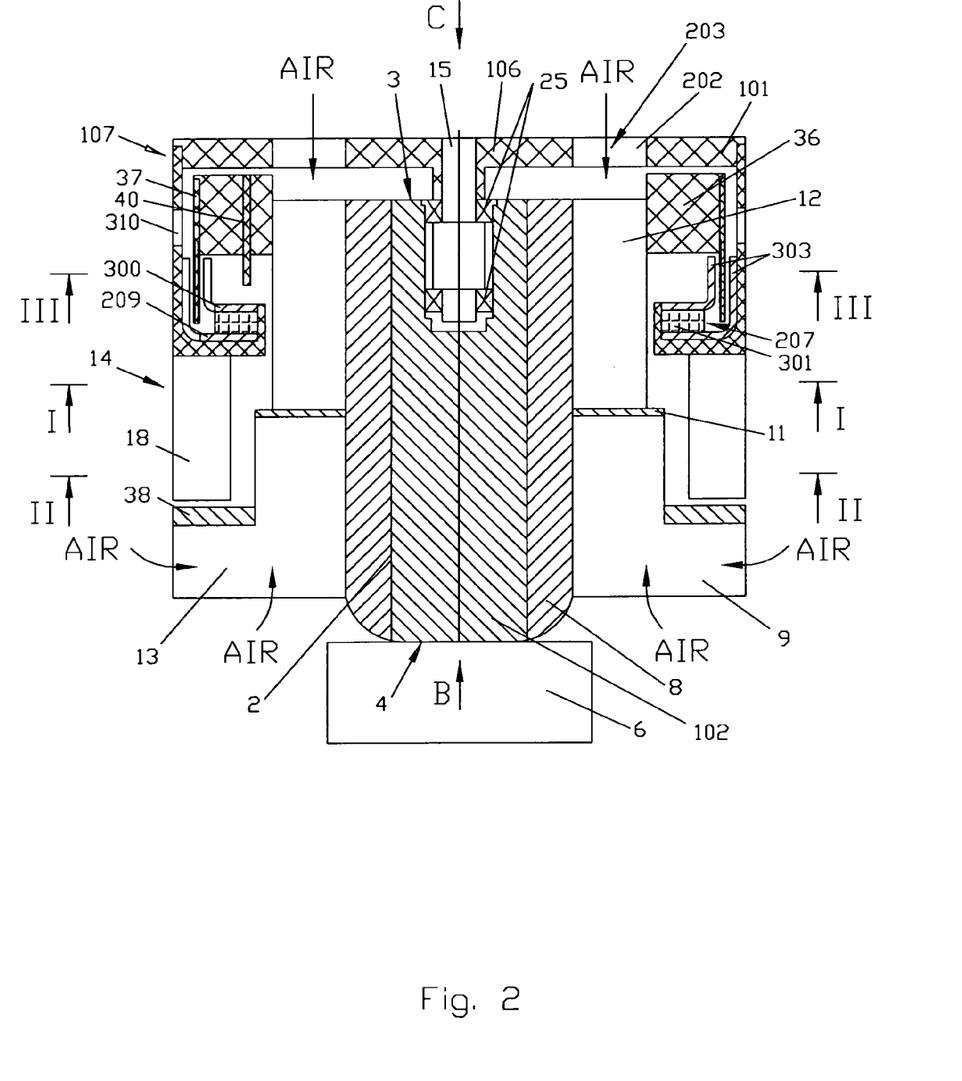
FIG. 2 is an axial sectional view showing a second embodiment of the present invention.
Figure 2A:
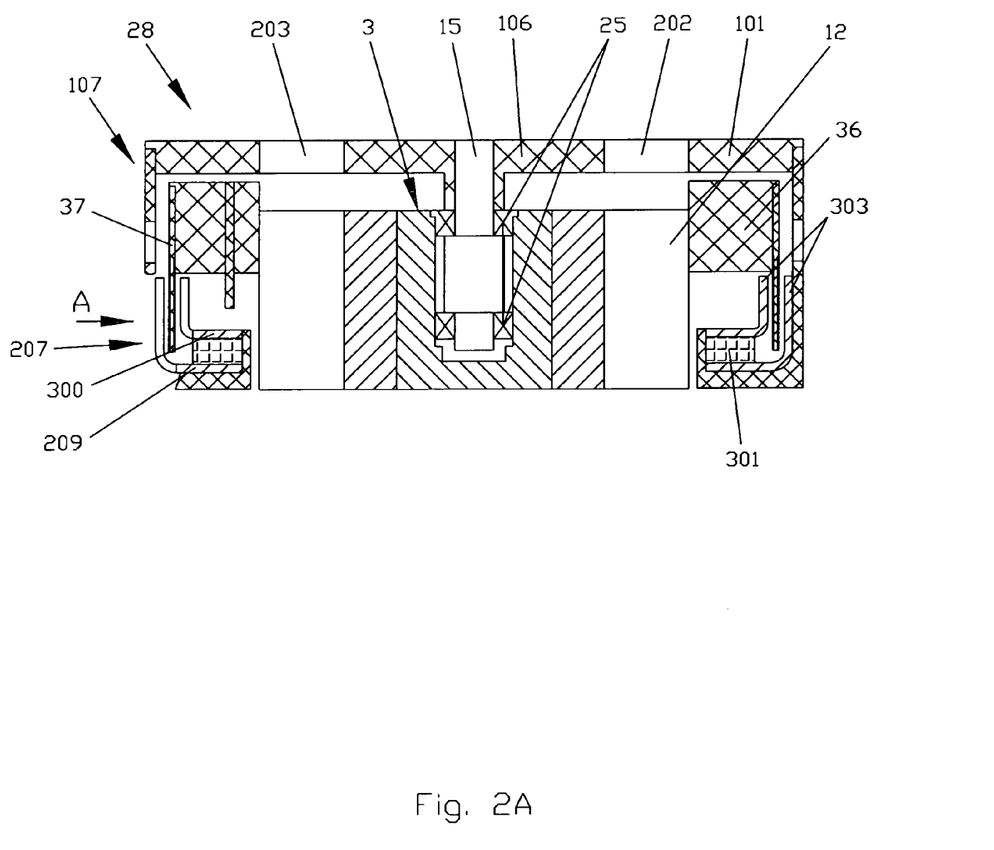
FIG. 2A is a partial axial sectional view of FIG. 2 with an opening to show the electric drive motor of the second embodiment of the present invention.

The design of the radial blower 14 shown in FIG. 2 was changed for the purpose of easier assembly. It is comprises a shaft 15, hub 106, shroud 107, and blades 18. These elements are connected to the hub 106 through blade shaped struts 202, to form the axial fan 203. The shroud 107, with its attached blades 18, is connected to the flat ring 101. The hub 107 has some holes 310 to allow for ventilation of the stator 37.

The design of the central core shown in FIG. 2 comprises the spreader 102 being made from high heat conductive metal, usually copper.

Figure 2B:
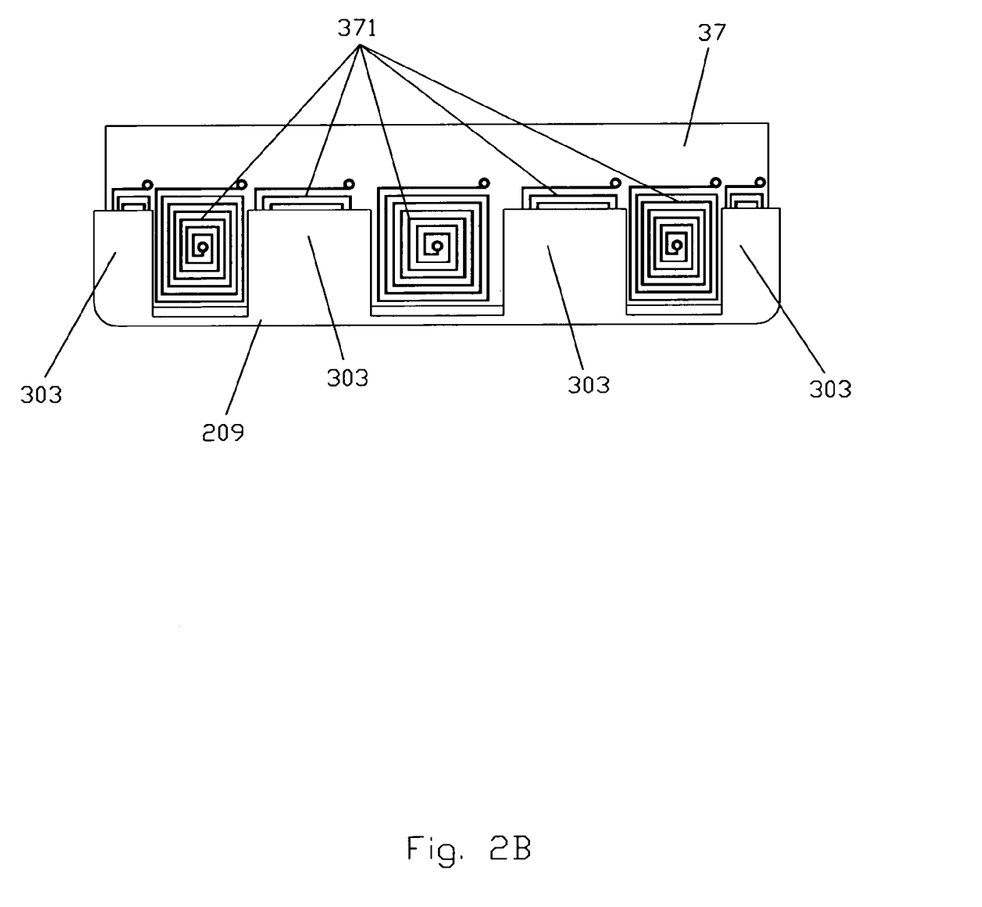
FIG. 2B is a side view taken along arrow A of FIG. 2A depicting the rotors relation to the stator board and its coils.

The second embodiment (FIGS. 2–7) differs from the first embodiment only in that the rotor 207 of the motor is made from two L-shaped bushings 209, 300. The other components are the same as in the first embodiment. Therefore the components the same as described above on FIG. 1 are denoted with the same reference numerals, for which description is omitted. These bushings 209, 300 are made from permeable thin metal, preferably silicon electric steel and are secured through the flat sides to at least one flat cylindrical permanent magnet 301. The cylindrical parts of the rotor bushings are facing up toward the top flat surface 3 of the core. These cylindrical parts have poles, in the shape of teeth 303 (FIG. 2B). The stator 37 (FIG. 7) of the second embodiment is relatively the same as the stator of the first embodiment. Stator 37 is formed by an array of printed coils 371 (FIG. 2B). These coils 371 are etched on a flat strip of printed circuit board material and the board strip is then rolled in the shape of a cylinder. To obtain additional magnetic strength from the stator coils, a multi-layer circuit board may be used (not shown in the drawings). This allows for more turns on each individual coil.

The stator coils 371 are constructed so that the width of each coil 371 is approximately the same width as each rotor pole 303 (FIG. 2B). If necessary the printed circuit board stator 37 (FIG. 2B) can be fabricated into separate pieces and then assembled together electrically and mechanically. Each and every adjacent coil on the stator board is connected, so when energized they produce opposite magnetic poles when viewed on the same side of the stator board. The stator coils 371 for this electric motor 28 are etched using standard circuit board fabricating means, on standard circuit board materials. The stator is made from circuit board material having metal layers, preferably copper, and the coil 371 is etched in the metal layers. Said metal layers may be plated by ferromagnetic material (not shown in the drawings). Said plated ferromagnetic material preferably is nickel.

The coils are arranged in a linear pattern the length of the circuit board. Half of one of these coils aligns symmetrically with the VIA connecting the other half coil on the opposite side of the board while maintaining the same turn direction. Each end of this coil is then series connected with one of the adjacent coils on the board. These adjacent coils are configured such that the current in their turns is flowing in the opposite direction to yield the opposite magnetic polarity. The coils form a continuous series connection with every adjacent coil having the same turn direction. Each adjacent coil has the opposite magnetic polarity at any one point in time. The beginning and end of the coils on the stator board are used for electrical lead attachment. The stator board is then shaped into a cylinder with the two ends of the stator board adjoined together. The two leads from the stator board attach to a Full Bridge Driver. The sensing element on motor controller 39 (FIG. 7) uses a Hall Effect Switch or Hall Effect Element to control commutation of the motor. An optical device may also be used but has limitations caused by interference from ambient light sources. The Hall device 39 (FIG. 7) is located in close proximity to the rotor teeth 303 (FIG. 2) and positioned to achieve proper rotational direction and optimum performance from the motor.

The single ended drive stator boards require a differently constructed stator board. This stator board requires two groups of coils 371 (FIG. 2B) wound in the same direction and having common magnetic polarities. The individual coils of one group are series connected and adjacently staggered and spaced between the coils of the other group. One end of each group of coils is connected together and ties to either the positive or negative lead of the motor power supply. If the single ended driver is a Low End Driver, then the connected ends of the coils tie to the positive supply; if a High End Driver then they are connected to the negative or ground supply. The other end of each of these two groups ties to the single ended driver. Only one of these groups of the coils is energized at any one point in time.

There are many versions of drives with different protection schemes available, however they all perform essentially the same control function. The Full Bridge Drive has a few advantages over the Single Ended Drive as can be seen in the following comparison table.

| Items for Comparison | Full Bridge Drive | Two Phase Single End Drive |
| --- | --- | --- |
| Stator Boards coil resistance seen by Motor Controller | Equals the sum of all individual stator coils | Equals ½the sum of all individual stator coils |
| Motor Magnetic Drive Operation | Push and Pull | Either Push or Pull |
| Motor efficiency | More efficient than Two Phase Single End Drive | Less efficient than Full Bridge Drive |
| Duty Cycle on Stator Board Coils | 100% | 50% |
| Electrical Attachment Points to Each Stator Board | 2 | 3 |
| Stator Board Construction | Requires 1 VIA for each Stator Coil | Requires 2 VIA'S for each stator Coil |

Operational Description

Figure 7:
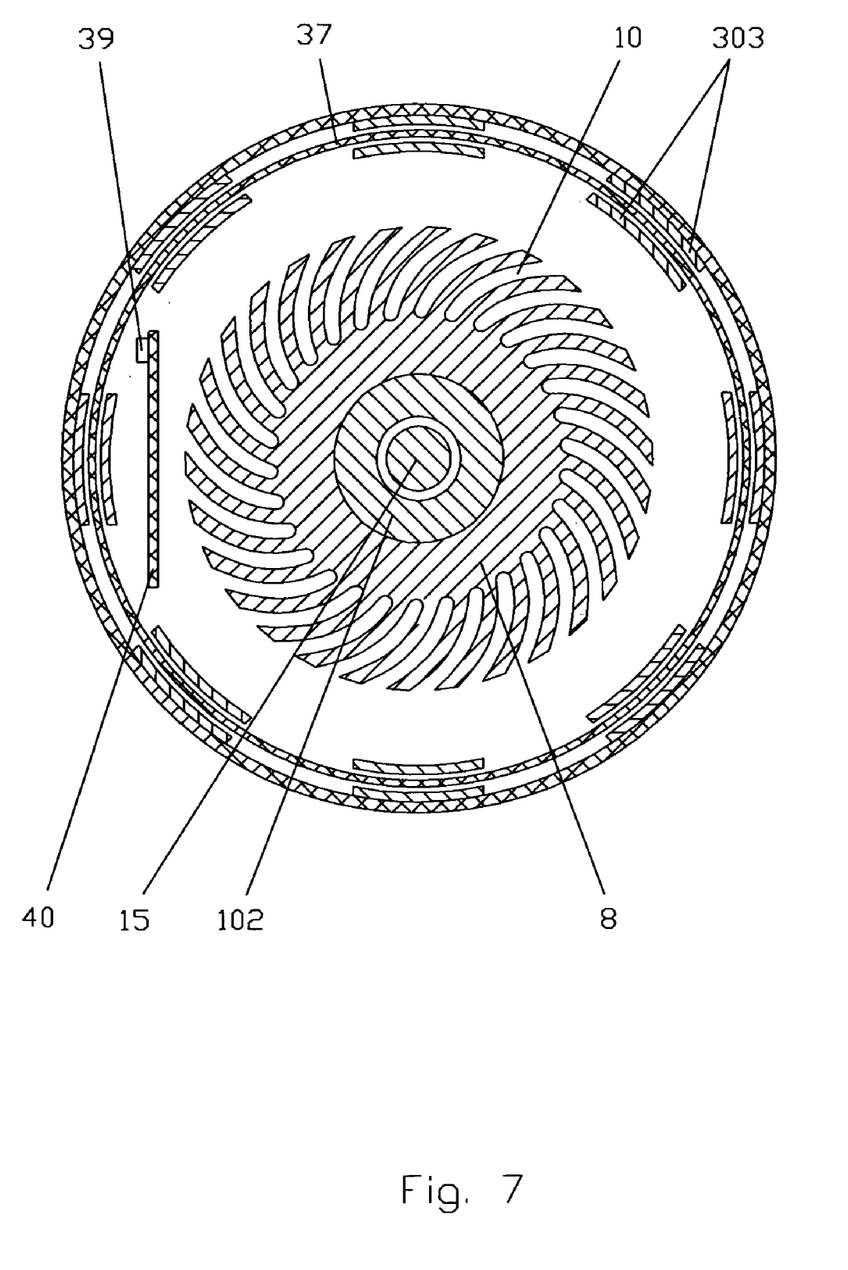
FIG. 7 is a sectional view taken along line III—III FIG. 2.

The operation of this cooler for electronic devices will be described using FIG. 1, FIG. 2B and FIG. 7.

The Hall Switch or Sensor 39 (FIG. 7) supplies a change in electrical states or levels that are used to operate the full bridge controller. These states or levels change in relation to the magnetic fields created by the teeth 303 and gaps of the permanent magnet rotor 27 (FIG. 1). If the Hall Switch is not aligned with one of the rotor teeth 303 (FIG. 2B), it supplies a voltage output signal that the bridge driver uses to energize the coils 371 (FIG. 2B) and move the rotor blades toward alignment with the attracting coils on the stator board. Before the rotor teeth 303 reaches the attracting coils the Hall Switch senses the rotors magnetic field and changes the state of the driver that causes the rotor teeth 303 to be attracted to the next or adjacent set of coils. Before the rotor teeth 303 reach this set of attracting coils the Hall Switch senses the loss of the rotor teeth 303 magnet field and changes the state of the driver causing it to be attracted to the next set of coils 371. This process continues to maintain a constant motion in one direction on the rotor.

The third embodiment (FIG. 8) differs from the second embodiment only in that the central core 1 comprises an evaporating chamber 7 having direct contact with an electronic component heat dissipating footprint 6.

Figure 8:
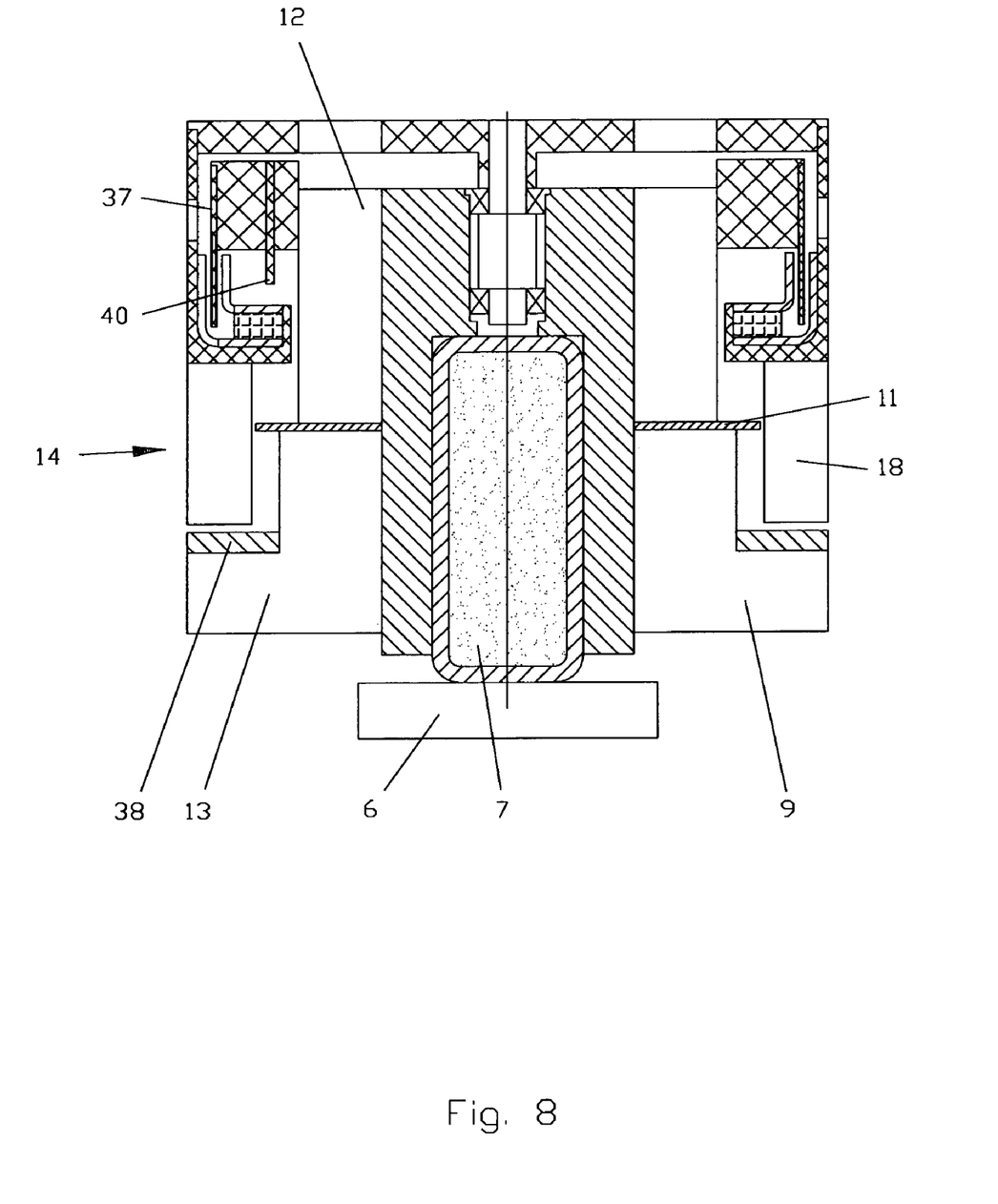
FIG. 8 is an axial sectional view showing a third embodiment of the present invention.

The other components are the same as in the second embodiment.

Figure 9:
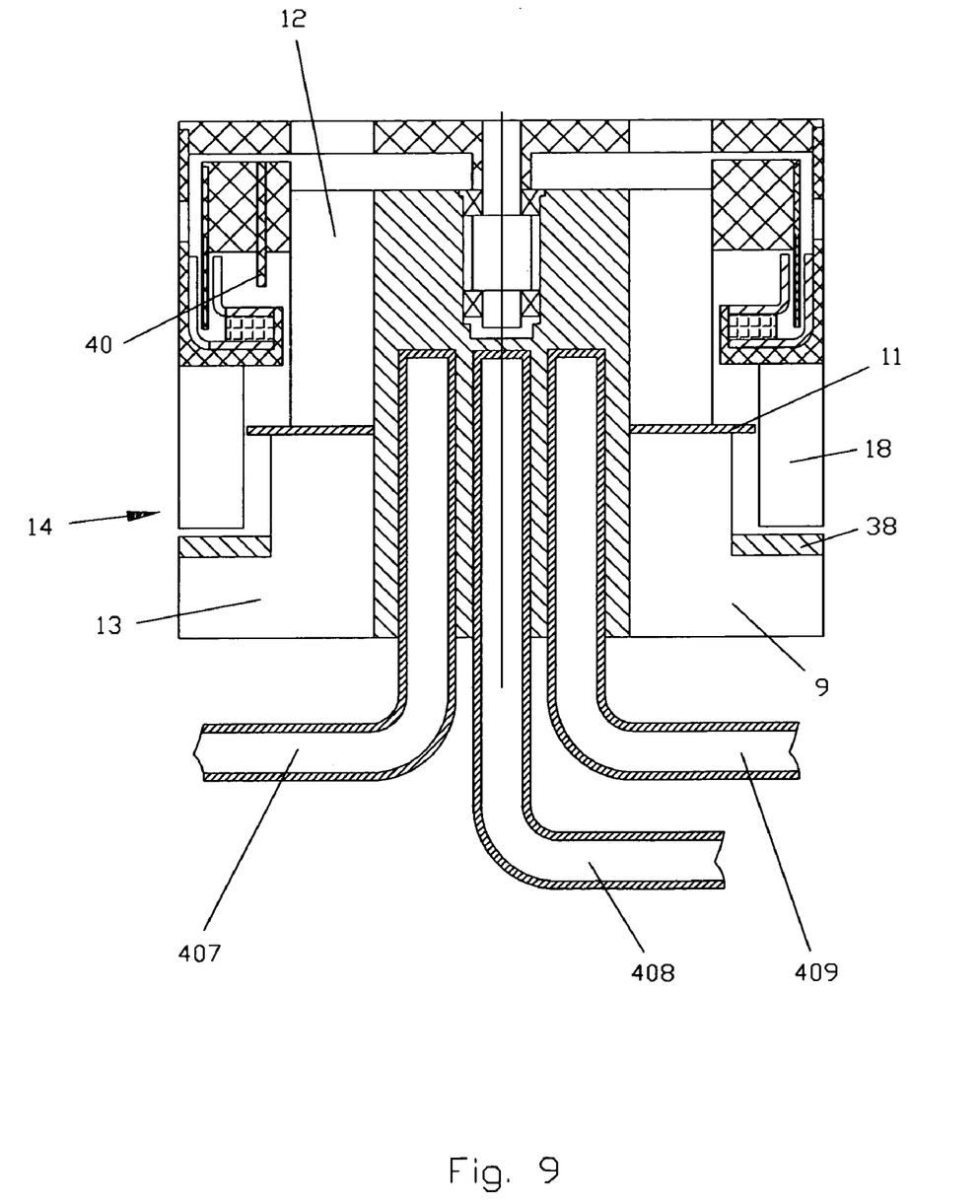
FIG. 9 is an axial sectional view showing a fourth embodiment of the present invention.

The fourth embodiment (FIG. 9) differs from the second embodiments only in that at least one or several (three) heat pipes 407, 408 and 409 are placed inside of the core 308. Each of the three-heat pipes transfers heat energy from separate electronic devices, not illustrated on the drawings. The other components are the same as in the second embodiment.

While the invention has been described with reference to various embodiments, it will be understood that these embodiments are only illustrative that the scope of the invention is not limited to them. Many variations, modifications and improvements of the embodiments described are possible. Variations and modifications of the embodiments disclosed herein may be made based on description set forth herein, without departing from the scope and spirit of the invention as set forth in the following claims.

What is claimed is:

1. A cooler for electronic devices comprising:

a heat exchange element, a blower with a centrifugal type impeller, and an electric drive, wherein;

(i) said heat exchange element comprising a central part with heat exchanging fins protruding out of said central part, and forming channels between adjacent fins for cooling air flow;

(ii) said centrifugal type impeller located around at least part of said heat exchange element and comprising a shroud, connected to a hub placed on bearings secured on said central part of heat exchange element;

(iii) said centrifugal type impeller having inner cylindrical space with open end faces to provide intake air through said fins channels from opposite axial directions;

(iv) said electric drive comprising a magnetic rotor and stator; said magnetic rotor is secured to the centrifugal type impeller, said stator of the electric drive is fixed to said heat exchange element.

2. The cooler for electronic devices as claimed in claim 1, wherein said electric drive including said magnetic rotor and said stator made as a hollow cylinder.

3. The cooler for electronic devices as claimed in claim 2 wherein said magnetic rotor comprising at least two coaxial hollow cylinders, each of said cylinders made as a magnetized cylinder, having circumferential arrayed like poles; said circumferential arrayed like poles being magnetized in radial direction and being distributed around an axis of rotation, said circumferential arrayed like poles of one of said magnetized cylinders spaced from the circumferential arrayed like poles of another of said magnetized cylinders in an radial direction to form a cylindrical gap, said circumferential arrayed like poles of said one magnetized cylinder face opposite polarities relative to said circumferential arrayed like poles of said another magnetized cylinder; and wherein in the view perpendicular to an axis of rotation, said circumferential arrayed like poles of said one magnetized cylinder about to coincide with said circumferential arrayed like poles of said another magnetized cylinder; said stator comprising a coil winding, being, at least partially, coaxially mounted into said cylindrical gap between said circumferential arrayed like poles of said both magnetized cylinders.

4. The cooler for electronic devices as claimed in claim 3 wherein said two hollow cylinders are made from ferromagnetic material, and are magnetized in radial direction by magnet ring installed between them.

5. The cooler for electronic devices as claimed in claim 4 wherein said ferromagnetic material is silicon electric steel.

6. The cooler for electronic devices as claimed in claim 3 wherein said circumferential arrayed like poles are made as teeth at an edge of said magnetized cylinder.

7. The cooler for electronic devices as claimed in claim 2 wherein said magnetic rotor comprising at least two coaxial L-shaped magnetized members, each of said at least two L-shaped members having a magnetized cylinder part and a flat ring bottom part, a magnetized cylinder part having circumferential arrayed like poles; said circumferential arrayed like poles being magnetized in radial direction and being distributed around an axis of rotation, said circumferential arrayed like poles of one of said magnetized cylinder part spaced from the circumferential arrayed like poles of another of said magnetized cylinder part in an radial direction to form a cylindrical gap, said circumferential arrayed like poles of said one magnetized cylinder part face opposite polarities relative to said circumferential arrayed like poles of said another magnetized cylinder part; and wherein in the view perpendicular to the axis of rotation, said circumferential arrayed like poles of said one magnetized cylinder part about to coincide with said circumferential arrayed like poles of said another magnetized cylinder part said stator comprising a coil winding, being, at least partially, coaxially mounted into said cylindrical gap between said circumferential arrayed like poles of said both magnetized cylinder parts.

8. The cooler for electronic devices as claimed in claim 7 wherein said two members are made from ferromagnetic material and are magnetized by magnet ring being magnetized in axial direction and installed between flat ring bottom parts.

9. The cooler for electronic devices as claimed in claim 8 wherein said ferromagnetic material is silicon electric steel.

10. The cooler for electronic devices as claimed in claim 7 wherein said circumferential arrayed like poles are made as teeth at an edge of said magnetized cylinder part.

11. The cooler for electronic devices as claimed in claim 2, wherein said stator are made from circuit board material having metal layers and a coil winding is etched in the metal layers.

12. The cooler for electronic devices as claimed in claim 11, wherein said metal layers are copper layers.

13. The cooler for electronic devices as claimed in claim 12, wherein said metal layers are plated by ferromagnetic material.

14. The cooler for electronic devices as claimed in claim 13, wherein said plated ferromagnetic material is nickel.

15. The cooler for electronic devices as claimed in claim 2, wherein said stator are round bended circuit board strip having metal layers wherein a coil winding is etched in the metal layers.

16. The cooler for electronic devices as claimed in claim 1, wherein said shroud is connected to said hub by brackets making inlet channels for cooling air flow.

17. The cooler for electronic devices as claimed in claim 16, wherein said brackets comprising blades of axial fan and provided cooling air flow through said fins channels to said centrifugal type impeller.

18. The cooler for electronic devices as claimed in claim 1 wherein said central part of said heat exchange element is a cylindrical central part.

19. The cooler for electronic devices as claimed in claim 1 wherein said central part of said heat exchange element has a flat bottom for direct contact with an electronic component heat-dissipating footprint.

20. The cooler for electronic devices as claimed in claim 19 wherein said flat bottom part of said heat exchange element and said electronic component heat dissipating footprint have about the same shape.

21. The cooler for electronic devices as claimed in claim 1 wherein said central part of said heat exchange element comprising a central spreader, said central spreader being made from high heat conductive metal.

22. The cooler for electronic devices as claimed in claim 1 wherein said central part of said heat exchange element comprising an evaporating chamber having direct contact with an electronic component footprints.

23. The cooler for electronic devices as claimed in claim 1 wherein said central part of said heat exchange element comprising at least one heat pipe.

24. The cooler for electronic devices as claimed in claim 1 wherein said heat exchanging fins protruding out of said central part in radial direction so that surface of said fins is parallel to central axis.

25. The cooler for electronic devices as claimed in claim 24 wherein said heat exchanging fins are made spiral-like and bent in the direction of centrifugal type impeller rotation.

26. The cooler for electronic devices as claimed in claim 25 wherein said spiral-like heat exchanging fins are bent so that channel width between two adjacent fins is constant.

27. The cooler for electronic devices as claimed in claim 1 wherein at least part of said heat exchanging fins is surrounded by said centrifugal type impeller.

28. The cooler for electronic devices as claimed in claim 1 further comprising a flat partition mounted on and perpendicularly to said central part of heat exchange element inside said centrifugal type impeller, said flat partition divides said fins in two parts and separate intake air flows from opposite axial directions.

29. The cooler for electronic devices as claimed in claim 1 wherein said bearings of said centrifugal type impeller mounted into said central part of heat exchange element.

* * * * *